Jan. 31, 1961 A. N. SAHAGUN 2,970,248

PIN MATERIAL FOR GLASS SEAL SEMICONDUCTOR RECTIFIER

Filed Nov. 12, 1957

ARMEN N. SAHAGUN,
INVENTOR.

BY Spensley and Horn

ATTORNEYS.

United States Patent Office
2,970,248
Patented Jan. 31, 1961

2,970,248

PIN MATERIAL FOR GLASS SEAL SEMICONDUCTOR RECTIFIER

Armen N. Sahagun, Los Angeles, Calif., assignor to Pacific Semiconductors, Inc., Culver City, Calif., a corporation of Delaware Filed Nov. 12, 1957, Ser. No. 695,759

17 Claims. (Cl. 317—236)

Figure 1:
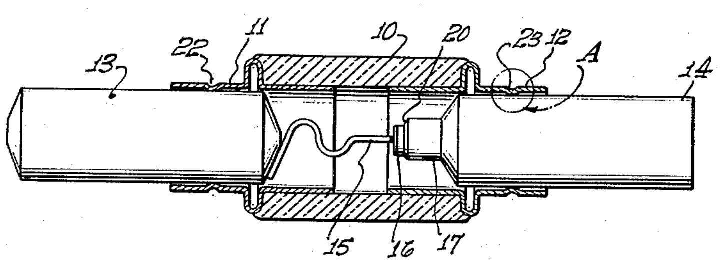

This invention relates to improvements in the brazing of metals and more particularly to a new and improved silver base alloy.

It has long been recognized in the semiconductor art that a hermetically sealed package, wherein the semiconductor material is mounted within a miniaturized cylindrical housing, the central region of which is composed of a glass tube, affords a foundation for designing the ideal package.

Many coaxial diode packages incorporating such a design may be found in the prior art. One type of prior art package comprises a central glass or ceramic tube which has metal sleeves sealed to the opposite ends thereof. These sleeves receive pins which are sealed to the sleeves, the pins carrying the semiconductor crystal and whisker or lead element connected thereto respectively. One example of such a prior art package is disclosed in British Patent No. 616,065 entitled "Improvements in and Relating to Crystal Contact Devices," issued June 17, 1949.

The relatively large diameter of the pins for a given material as that disclosed for example in the British patent and in other prior art packages, permits a greater thermal and electrical conductivity than was previously obtainable. Thus, the maximum current which a diode encased in such a package can tolerate is increased. This may be contrasted with the relatively small diameter wires used in other prior art glass sealed semiconductor diode packages.

The tubes for receiving these pins are usually metal sleeves or the like which have a thermal coefficient of expansion of the same order of magnitude as glass. One example of such a material is Kovar. Another example of a semiconductor package using such a sleeve is disclosed and claimed in co-pending U.S. patent application, Serial No. 497,353 entitled "Glass Sealed Crystal Rectifier," by Justice N. Carman, Jr., filed March 21, 1955, now Patent No. 2,881,369, assigned to the assignee of the present invention. It is particularly important that the package be hermetically sealed to protect the crystal element mounted therein from the adverse effects of moisture or other possible contaminants in the ambient. It is especially critical when the crystal element is composed of semiconductor material such as germanium or silicon, which is particularly sensitive to even slight increases in humidity.

Still another characteristic essential to the ideal semiconductor package is that its overall dimensions must be relatively small while permitting relatively large power dissipation by the device. An ideally encased crystal rectifier, for example, should be capable of dissipating of the order of one or more watts of heat energy, whereas the majority of the crystal rectifiers of the present art have rated power dissipation of the order of $\frac{1}{10}$ of a watt.

Another feature of the ideal semiconductor housing which is of the utmost significance is that it be of simple design and mechanically rugged. More specifically, it should be able to withstand severe shocks without breakage or mutilation, and be capable of being incorporated in electrical circuits with a minimum of effort and time. More particularly, the housing should be adapted to cooperate with plug-in connectors, or with the conventional wire receiving terminals known to the art. In addition, the mechanical properties of the housing should be such as to prevent variations of the electrical characteristics of the completed device due to dimensional variations caused by changes in the temperature of the housing and variations in relative humidity. Moreover, the elements of the envelope should be relatively inexpensive and easily fabricated so that they may be combined to provide an inexpensive yet reliable unitary structure.

The glass sealed diodes of the prior art such as that described in the aforementioned Carman application employ glass-to-metal seals between the glass housing and the associated electrodes with an intermediate Kovar type sleeve which in turn has sealed to it an electrode in the form of a pin made of metal which in itself is brazable to Kovar.

Many of the glass sealed diodes of the prior art are made with solder. Solder joints are notoriously undependable when employed to provide a gas tight seal at relatively high operating temperatures as solder generally has a low melting point.

As pointed out hereinabove, the principal disadvantage of the prior art glass sealed diodes which employ Kovar sleeves is that the electrodes are seldom, if ever, perfectly hermetically sealed to the Kovar sleeve, or in other words, seldom provide complete gas tight seals, even when brazed thereto.

Another extremely significant disadvantage of all of the prior art glass sealed diodes is that the final sealing of the package is accomplished by the application of heat either by welding or brazing to the package in the vicinity of the semiconductor crystal, thereby subjecting the crystal to temperatures which are sufficiently high to be injurious to its crystalline structure. Moreover, sputtering of the materials being joined and other allied phenomena such as degassing at the sealing temperature frequently cause contamination of the crystal.

The present invention, on the other hand, overcomes the above and other disadvantages by providing a glass sealed crystal rectifier, the housing of which incorporates all of the features of the ideal envelope for semiconductor diodes.

According to the basic concept of the invention, there is provided an improved alloy as the pin material to effect a hermetic seal with the Kovar sleeves which comprises the envelope or housing subassembly. The semiconductor package described and claimed in the hereinabove mentioned application by Justice N. Carman, Jr. satisfies all of the requirements discussed. However, it has been found in the welding or resistance brazing operation wherein the Kovar sleeves are sealed to the metal pins or electrodes to form the hermetic seal, that some release of contaminants such as the volatilizing of phosphorous or other low vapor pressure elements from the pins occurs and causes crystal damage in a certain percentage of the devices so constructed. The present invention involves the application of a new alloy pin material for use as the electrodes in the package as disclosed in the Carman application, for example.

Among the advantages achieved by the use of the new alloy material for the electrodes of the package of the present invention are the following: higher electrical and thermal conductivity is achieved, no volatile elements such as phosphorous are present in the alloy at brazing temperature, thus eliminating their volatilization. The brazing temperature is approximately 550° C. for the presently preferred embodiment, while the brazing temperature of the Carman package pin alloy is approximately 650° C. This lower brazing temperature is advantageous in that it permits a wider choice of elements which will not volatilize and therefore less crystal damage will result. Further, less wear on the welding wheel and less power will be required by the welding apparatus resulting in less oxidation of the elements in the pin and shell materials. Thus, the materials will better flow together to form a more nearly perfect hermetic seal. Further, as less heat is required, there is less likelihood for the solder which joins the crystal to one of the electrodes to melt or soften. Thus, a lower melting point solder than was formerly permissible may be used. Another advantage is the higher brazability to Kovar of the new electrode material.

It is therefore an object of the present invention to improve the brazability of electrodes or pins to Kovar or the like.

Another object of the present invention is to lower the brazing temperature of the metal alloy suitable for electrodes in glass sealed semiconductor packages.

A further object of the present invention is to provide an improved electrode pin material for semi-conductor devices of the type described which reduces sputter during the resistance brazing operation.

Still another object of the present invention is to provide an alloy which is self-fluxing and yet is relatively easy to work.

Yet another object of the present invention is to provide an alloy which is resistance brazable and relatively easy to work.

A still further objejct of the present invention is to provide an improved electrode pin material for semiconductor devices of the type described which improves the degradation characteristics of the completed device.

The novel features which are believed to be characteristic of the invention, together with further objects and advantages thereof, will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

Figure 2:
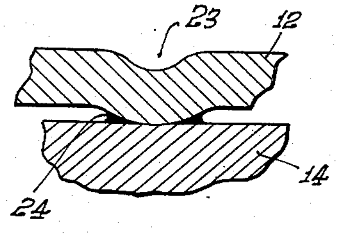

In the drawing:

Figure 1 is a view partly in section of a semiconductor diode package assembly using metal electrodes made of the alloy in accordance with the present invention; and Figure 2 is an enlarged view partly in section of section A of Figure 1.

Referring now to the drawing and particularly to Figure 1 there is shown a central glass cylinder 10 to which have been fused so called "bumped" tubes 11 and 12 forming a hermetic seal between the tubes and the glass cylinder. Inserted within tubes 11 and 12 are pins 13 and 14 which are made of an alloy in accordance with the present invention. A whisker element 15 is connected by spot welding, for example, to pin or electrode 13 as shown while semiconductor crystal 16 is affixed to pedestal 17 of pin 14 by solder 20 to complete the device. As the whisker element is usually spot welded to the electrode it is desirable that the electrode material be easily weldable to the whisker which is typically made of molybdenum or the like. It has been found that the alloy of the present invention achieves this end.

To complete the hermetic seal of the package the tubes are resistance brazed at 22 and 23 to pins 13 and 14. In Figure 2 a typical brazed joint is amplified. As the melting point of Kovar is 1100° C., a true welded joint cannot be achieved between tubes 11 and 12 and pins 13 and 14 unless the melting point of the pin material approaches that of Kovar. Since any such material has a relatively low electrical and thermal conductivity, among other disadvantages, it is not suitable as an electrode.

A brazed joint must therefore be produced which effects a hermetic seal between the pin material and the bumped tube. The alloy of the present invention has been found to be particularly suitable for the purposes hereinabove discussed. Filler 24 which is pin material which had melted during brazing and solidified upon cooling further acts to fill in the region between the Kovar shell 12 and the pin 14 to insure a hermetic seal therebetween.

In accordance with the present invention an alloy is provided containing the following ingredients based upon percentages by weight.

| | |
|---|---|
| Silver | 30–80 |
| Copper | 5–80 |
| Indium | 0.1–18 |
| Zinc | 0–30 |
| Lithium | 0.01–5 |

Within these composition ranges there are a number of specific alloys which have been found to be of particular importance. Several of these are listed hereinbelow:

| | | |
|---|---|---|
| (1) | Silver | 5–60 |
| | Copper | 5–50 |
| | Zinc | 15–18 |
| | Indium | 4–6 |
| | Lithium | 0.2–0.4 |
| (2) | Silver | 5–60 |
| | Copper | 5–50 |
| | Indium | 15–18 |
| | Zinc | 0–30 |
| | Lithium | 0.01–5 |
| (3) | Silver | 30–80 |
| | Copper | 5–80 |
| | Indium | 1–15 |
| | Zinc | 0–30 |
| | Lithium | 0.01–5 |
| (4) | Silver | 56 |
| | Copper | 22 |
| | Zinc | 17 |
| | Indium | 4.6 |
| | Lithium | 0.4 |
| (5) | Silver | 55 |
| | Copper | 22 |
| | Zinc | 17 |
| | Indium | 4.5 |
| | Lithium | 0.5 |
| (6) | Silver | 60 |
| | Copper | 30 |
| | Indium | 9 |
| | Lithium | 1 |

Copper-silver alloys have heretofore been used for many purposes. However, in none of such prior art alloys has there been, in addition to other added elements such as lithium, or zinc, any indium.

The addition of indium together with lithium is considered to be of extreme importance in the present invention. The use of indium as a constituent of the alloy of the present invention increases the workability of the alloy making it readily drawable into a wire. It is desirable to produce this alloy in wire form, the outer diameter of which corresponds to that of the pins to be produced, whereby the wire may then simply be cut to the proper length.

The presence of lithium within the ranges specified is considered to be responsible for the improved degradation characteristics found in diodes so produced. This is thought to be due to the fact that during the temperature aging process, which is a standard quality control step during which the diodes are subjected to a temperature of 150° C. for a prolonged period, lithium precipitates out and combines with any contaminants which may be present. This effectively means that the diodes' electrical characteristics are actually improved after having been hermetically sealed.

As the present alloy is self-fluxing due to the presence of lithium within the ranges specified there is no observable sputter during the brazing operation, but instead an even seam is formed as indicated at 24 of Figure 2. This improved seal eliminates the need for a post sealing operation such as impregnation by use of a resin or the like. Further, the need for surface coatings such as "glit" on the surface of the crystal to prevent shorting of the junction by sputtering or the like is eliminated.

Other advantages of the alloy of the present invention, particularly for use as the pin material hereinabove discussed, is the fact that the alloy does not contain any elements which will become volatile at or below the brazing temperature which is approximately 500° C. Undesirable vapors in prior art pin materials often resulted in condensates which formed on the semiconductor crystal thereby adversely affecting device characteristics.

Further, as the brazing temperature is approximately 550° C., some 100° C. lower than prior art materials, crystal damage as well as diffusion of contaminants into the crystal is minimized during the final sealing operation. In addition, at this lower temperature less oxidation takes place in the elements of the pin material permitting the metals of the pin material and the tubes or sleeves to better flow together to form a more perfect hermetic seal.

Further, lithium oxide which must of necessity form, together with oxides of iron and nickel, from the Kovar, will form low melting point fusible compounds which dissolves at the brazed joint.

Another advantage inherent in the use of a lower melting point alloy of the present invention is that the solder securing the crystal to the pin will be less likely to melt during the brazing operation.

Another advantage obtained by the use of the alloy of the present invention for the pin material in device packages as above described is that no brittle compounds are formed at the brazing temperature in the vicinity of the joint. The prior art pin materials may form brittle compounds which produce fractures in the completed package upon its subjection to either thermal or mechanical shock.

While the alloy of the present invention has been discussed with respect to its use as a pin material in a certain type of semiconductor package, its use need not be so limited. It may also be used as a brazing alloy for stainless steel and other iron alloys.

What is claimed is:

1. A preformed structural element consisting essentially of:

| | Percent |
|---|---|
| Silver | 30–80 |
| Copper | 5–80 |
| Indium | 0.1–18 |
| Zinc | 0–30 |
| Lithium | 0.01–5 |

2. A preformed structural element consisting essentially of:

| | Percent |
|---|---|
| Silver | 5–60 |
| Copper | 5–50 |
| Indium | 15–18 |
| Zinc | 0–30 |
| Lithium | 0.01–5 |

3. A preformed structural element consisting essentially of:

| | Percent |
|---|---|
| Silver | 30–80 |
| Copper | 5–80 |
| Indium | 1–15 |
| Zinc | 0–30 |
| Lithium | 0.01–5 |

4. A preformed structural element consisting essentially of:

| | Percent |
|---|---|
| Silver | 5–60 |
| Copper | 5–50 |
| Zinc | 15–18 |
| Indium | 4–6 |
| Lithium | 0.2–0.4 |

5. A preformed structural element consisting essentially of:

| | Percent |
|---|---|
| Silver | 56 |
| Copper | 22 |
| Zinc | 17 |
| Indium | 4.6 |
| Lithium | 0.4 |

6. A preformed structural element consisting essentially of:

| | Percent |
|---|---|
| Silver | 55 |
| Copper | 22 |
| Zinc | 17 |
| Indium | 4.5 |
| Lithium | 0.5 |

7. A preformed structural element consisting of:

| | Percent |
|---|---|
| Silver | 60 |
| Copper | 30 |
| Indium | 9 |
| Lithium | 1 |

8. A homogeneous silver alloy preformed structural element having a melting point in the range from 450° C. to 620° C. being substantially impervious to the ambient and being readily brazable to Kovar, said alloy consisting essentially of the following elements indicated based upon percentages by weight:

| | |
|---|---|
| Silver | 30–80 |
| Copper | 5–80 |
| Indium | 0.1–15 |
| Zinc | 0–30 |
| Lithium | 0.05–5 |

9. In a semiconductor crystal diode of the type having large metal pins as electrodes hermetically sealed within an envelope subassembly wherein said subassembly consists of an annular glass sleeve having beaded metal tubes sealed within opposite ends thereof, said metal pins being resistance brazed to said tubes and conisting essentially of the following elements indicated based upon percentages by weight:

| | |
|---|---|
| Silver | 30–80 |
| Copper | 5–80 |
| Indium | 0.1–15 |
| Zinc | 0–30 |
| Lithium | 0.05–5 |

10. The diode defined in claim 9 wherein said metal pins consist essentially of the following elements based upon percentages by weight:

| | |
|---|---|
| Silver | 5–60 |
| Copper | 5–50 |
| Indium | 15–18 |
| Zinc | 0–30 |
| Lithium | 0.01–5 |

11. The diode defined in claim 9 wherein said metal pins consist essentially of the following elements based upon percentages by weight:

| | |
|---|---|
| Silver | 30–80 |
| Copper | 5–80 |
| Indium | 1–15 |
| Zinc | 0–30 |
| Lithium | 0.01–5 |

12. The diode defined in claim 9 wherein said metal pins consist of the following elements based upon percentages by weight:

| | |
|---|---|
| Silver | 60 |
| Copper | 30 |
| Indium | 9 |
| Lithium | 1 |

13. A homogeneous silver alloy preformed structural element having a melting point in the range from 450° C. C. to 620° C. being substantially impervious to the ambient and being readily brazable to Kovar, said alloy consisting of the following elements indicated based upon percentages by weight:

| | |
|---|---|
| Silver | 56 |
| Copper | 22 |
| Zinc | 17 |
| Indium | 4.6 |
| Lithium | 0.4 |

14. In a semiconductor crystal diode of the type having large metal pins as electrodes hermetically sealed within an envelope subassembly wherein said subassembly consists of an annular glass sleeve having beaded metal tubes sealed within opposite ends thereof, said metal pins being resistance brazed to said tubes and consisting of the following elements indicated based upon percentages by weight:

| | |
|---|---|
| Silver | 56 |
| Copper | 22 |
| Zinc | 17 |
| Indium | 4.6 |
| Lithium | 0.4 |

15. A homogeneous silver alloy preformed structural element having a melting point in the range from 450° C. to 620° C. being substantially impervious to the ambient and being readily brazable to Kovar, said alloy consisting of the following elements indicated based upon percentages by weight:

| | |
|---|---|
| Silver | 55 |
| Copper | 22 |
| Zinc | 17 |
| Indium | 4.5 |
| Lithium | 0.5 |

16. In a semiconductor crystal diode of the type having large metal pins as electrodes hermetically sealed within an envelope subassembly wherein said subassembly consists of an annular glass sleeve having beaded metal tubes sealed within opposite ends thereof, said metal pins being resistance brazed to said tubes and consisting of the following elements indicated based upon percentages by weight:

| | |
|---|---|
| Silver | 55 |
| Copper | 22 |
| Zinc | 17 |
| Indium | 4.5 |
| Lithium | 0.5 |

17. Alloys consisting essentially of:

| | Percent |
|---|---|
| Silver | 30–80 |
| Copper | 5–80 |
| Indium | 0.1–18 |
| Lithium | 0.01–5 |

References Cited in the file of this patent

UNITED STATES PATENTS

| | | |
|---|---|---|
| 2,196,303 | Hensel et al. | Apr. 9, 1940 |
| 2,235,634 | Hensel et al. | Mar. 18, 1941 |
| 2,464,821 | Ludwick | Mar. 22, 1949 |
| 2,596,454 | Williams | May 13, 1952 |